US012782387B2

(12) United States Patent
Kera

(10) Patent No.: US 12,782,387 B2
(45) Date of Patent: Nov. 3, 2026

(54) PROBER WITH FALLING RESTRICTION MECHANISM

(71) Applicant: TOKYO SEIMITSU CO., LTD., Hachioji (JP)

(72) Inventor: Toya Kera, Hachioji (JP)

(73) Assignee: TOKYO SEIMITSU CO., LTD., Hachioji (JP)

( * ) Notice: Subject to any disclaimer, the term of this patent is extended or adjusted under 35 U.S.C. 154(b) by 100 days.

(21) Appl. No.: 19/082,709

(22) Filed: Mar. 18, 2025

(65) Prior Publication Data

US 2025/0306058 A1 Oct. 2, 2025

(30) Foreign Application Priority Data

Mar. 28, 2024 (JP) ................................. 2024-054129

(51) Int. Cl.
*G01R 1/04* (2006.01)
*G01R 31/28* (2006.01)

(52) U.S. Cl.
CPC ....... *G01R 1/0491* (2013.01); *G01R 31/2831* (2013.01)

(58) Field of Classification Search
CPC .............. G01R 1/0491; G01R 31/2831; G01R 31/2891; G01R 1/06711; G01R 31/2863; G01R 31/2879
See application file for complete search history.

(56) References Cited

U.S. PATENT DOCUMENTS

| | | | | |
|---|---|---|---|---|
| 9,134,357 | B1 * | 9/2015 | Fox | G01R 31/2887 |
| 10,416,228 | B2 * | 9/2019 | Nagashima | G01R 31/2887 |
| 2007/0164770 | A1 * | 7/2007 | Casler, Jr. | G01R 31/2891 324/754.03 |
| 2011/0043237 | A1 | 2/2011 | Kiyokawa et al. | |
| 2013/0147506 | A1 * | 6/2013 | Yamada | G01R 1/0491 324/756.03 |
| 2020/0003803 | A1 * | 1/2020 | Nelson | G01R 31/2887 |

FOREIGN PATENT DOCUMENTS

| | | | |
|---|---|---|---|
| JP | 2020-113701 | A | 7/2020 |
| WO | 2011/016097 | A1 | 2/2011 |

* cited by examiner

*Primary Examiner* — Alvaro E Fortich
(74) *Attorney, Agent, or Firm* — PROCOPIO, CORY, HARGREAVES & SAVITCH LLP

(57) ABSTRACT

A prober includes a measurement unit, a wafer chuck, an alignment device, and a falling restriction mechanism. The wafer chuck holds a wafer on its upper surface and is held on the lower surface of the measurement unit. The falling restriction mechanism restricts falling of the wafer chuck from the lower surface of the measurement unit. The falling restriction mechanism includes a plurality of falling restriction claws and a position control device. The position control device can switch positions of the plurality of falling restriction claws between a retracted position for allowing the wafer chuck to pass between the falling restriction claws, an intermediate position for receiving the wafer chuck separated from the lower surface of the measurement unit from below, and an advanced position for centering the wafer chuck.

5 Claims, 12 Drawing Sheets

PROBER WITH FALLING RESTRICTION MECHANISM

BACKGROUND OF THE INVENTION

Field of the Invention

The present invention relates to a prober that inspects electrical characteristics of semiconductor devices (chips) formed on a semiconductor wafer.

Priority is claimed on Japanese Patent Application No. 2024-054129, filed Mar. 28, 2024, the content of which is incorporated herein by reference.

Description of Related Art

A semiconductor manufacturing process involves many processes, and a plurality of types of inspections are performed at each manufacturing process to ensure quality and improve yield. For example, at a stage in which a plurality of chips, which are semiconductor devices, have been formed on a semiconductor wafer (hereinafter simply referred to as a "wafer"), wafer-level inspection is performed in which electrodes of each chip are connected to a test head, a power supply current and a test signal are supplied from the test head, and signals output by each chip are measured by the test head, thereby electrically inspecting whether they operate normally.

After the above-described wafer-level inspection, the wafer is attached to a frame and cut into individual chips by a dicer. Among the cut chips, only chips that are confirmed to operate normally are packaged in the next assembly process, and chips that do not operate properly are removed from the assembly process. Further, the packaged final products are inspected for shipment.

The wafer-level inspection is performed using a prober that causes probes to come into contact with the electrodes of each chip on the wafer. The probes brought into contact with the electrodes are provided on a probe card mounted on the test head. The probes are electrically connected to terminals of the test head. The power supply current and the test signal supplied from the test head are input to each chip through the probes, and output signals from each chip are output to the test head through the probes. The test head measures the signals output from each chip and determines whether the chips operate normally or not on the basis of the measured values.

As a prober used in wafer-level inspection, a prober that uses a wafer chuck (wafer tray), which holds a wafer on its upper surface side and, in that state, sticks it by vacuum suction to a lower surface of a ceiling wall of a housing (a lower surface of a measurement unit), is known (see, for example, Patent Documents 1 and 2).

This prober holds the wafer chuck holding the wafer serving as an inspection target and sticks it by vacuum suction to the lower surface of the ceiling wall of the housing, thereby pressing the electrodes on the wafer against the corresponding probes on the probe card to maintain the connection between each probe and the corresponding electrode. In the case of this prober, since the wafer and the probe card can be kept connected only by the wafer chuck, there is no need to keep an alignment device, which positions the wafer and the probe card via the wafer chuck and transports the wafer chuck, below the measurement unit. For this reason, the alignment device can be shared with other measurement units.

In addition, in the case of this type of prober in which the wafer chuck is held to the ceiling wall of the housing by vacuum suction, when the power is turned off while the wafer chuck is stuck by suction, there is a concern that the wafer chuck may fall downward.

For this reason, the prober described in the cited Documents 1 and 2 is provided with a falling restriction mechanism that mechanically restricts falling of the wafer chuck. This falling restriction mechanism is provided with a hook member on either the wafer chuck or the ceiling wall of the housing, which can mechanically engage with the other. In the prober, by displacing the hook member to a position at which it can engage with a mating member with the vacuum suction of the wafer chuck, it is possible to restrict accidental falling of the wafer chuck.

PATENT DOCUMENTS

[Patent Document 1] International Publication No. 2011/016097.

[Patent Document 2] Japanese Unexamined Patent Application, First Publication No. 2020-113701.

SUMMARY OF THE INVENTION

The prober described in Patent Documents 1 and 2 can restrict falling of the wafer chuck using the falling restriction mechanism even if the wafer chuck stuck by suction to the ceiling wall is separated from the ceiling wall due to the power being turned off or other reasons. However, when the wafer chuck is transferred from this state to an engagement part of the alignment device, a position of the wafer chuck may deviate from the engagement part of the alignment device waiting at a regular position.

In this case, the alignment device needs to detect the position of the wafer chuck using a camera or the like mounted on the device and adjust a position of the engagement part toward the detected position. However, if there is a large deviation between the position of the engagement part of the alignment device and the position of the wafer chuck, it takes a long time to detect the position of the wafer chuck and adjust the position of the alignment device. This is not desirable from the perspective of improving throughput, and prompt improvement is desired.

Thus, the present invention aims to provide a prober that can transfer a wafer chuck to an alignment device in a suitable position even after the wafer chuck has separated from a lower surface of a measurement unit and been temporarily held by a falling restriction mechanism.

A prober according to one aspect of the present invention includes: a measurement unit including a probe card electrically connected to a test head; a wafer chuck that holds a wafer, on which a plurality of chips are formed, on an upper surface thereof and is held on a lower surface of the measurement unit to bring electrodes of the chips into contact with corresponding probes of the probe card; an alignment device that detachably engages with the wafer chuck and aligns the wafer held by the wafer chuck with respect to the probe card; and a falling restriction mechanism configured to restrict falling of the wafer chuck from the lower surface of the measurement unit, wherein the falling restriction mechanism includes a plurality of falling restriction claws that are provided on the lower surface side of the measurement unit to be advanceable and retractable and restrict the falling of the wafer chuck from the lower surface of the measurement unit in an advanced state, and a position control device configured to control advanced and retracted positions of the plurality of falling restriction claws, and the position control device is able to switch positions of the plurality of falling restriction claws to a retracted position for allowing the wafer chuck to pass between the falling restriction claws, an intermediate position for receiving the wafer chuck separated from the lower surface of the measurement unit from below, and an advanced position for centering the wafer chuck.

In the prober of the present embodiment, in operation of bringing the plurality of falling restriction claws to the retracted position by the control of the position control device, the wafer chuck can pass between the plurality of falling restriction claws. In this state, raising or lowering and positional adjustment of the wafer chuck by the alignment device is possible. In this state, the position of the wafer chuck holding the wafer on its upper surface is adjusted by the alignment device, and then the wafer chuck is raised by the alignment device. Then, the wafer chuck is fixed to the lower surface of the measurement unit by vacuum suction.

Then, the plurality of falling restriction claws are operated to the intermediate position by the control of the position control device. As a result, even if the wafer chuck stuck by suction to the measurement unit is accidentally separated from the measurement unit due to the power being turned off or other reasons, the wafer chuck will be received from below by the plurality of falling restriction claws. In addition, from this state, when the plurality of falling restriction claws are operated to the advanced position by the control of the position control device, the plurality of falling restriction claws will center the wafer chuck. As a result, a positional deviation of the wafer chuck from the alignment device below is corrected. Then, when the alignment device rises, the wafer chuck is transferred to the alignment device at a suitable position.

An outer circumferential edge portion of the wafer chuck may be formed in a circular shape concentric with the wafer held on the upper surface of the wafer chuck, and each of the falling restriction claws may advance and retract to move in a radial direction of the wafer chuck.

In this case, since the falling restriction claws advance and retract to move in the radial direction of the wafer chuck, they can advance and retract in the shortest distance without loss relative to the lower surface of the wafer chuck. In addition, the plurality of falling restriction claws can quickly center the wafer chuck when displaced to the advanced position.

Two or more of the falling restriction claws are preferably provided apart from each other in an outer circumferential direction of the wafer chuck.

In this case, by displacing the two or more falling restriction claws to the advanced position, the wafer chuck can be centered easily and accurately.

Each of the falling restriction claws may include a horizontal support surface that is able to support a lower surface of the outer circumferential edge portion of the wafer chuck, and a restriction wall that rises from an end portion of the support surface on a side away from an axial center position of the wafer chuck, and a surface of the restriction wall facing the outer circumferential edge portion of the wafer chuck may be configured as a centering surface that abuts the outer circumferential edge portion of the wafer chuck when the falling restriction claws are in the advanced position.

In this case, when the wafer chuck is separated from the lower surface of the measurement unit while the falling restriction claws are in the intermediate position, the outer circumferential edge portion of the wafer chuck is placed on the support surfaces of the falling restriction claws. From this state, when the falling restriction claws are displaced to the advanced position, the centering surfaces of the rising walls abut the outer circumferential edge portion of the wafer chuck. As a result, the wafer chuck is centered by the centering surfaces while still placed on the support surfaces of the falling restriction claws. Accordingly, in the case of adopting the present configuration, it is possible to displace the wafer chuck to a suitable position while maintaining a stable posture.

The centering surface may be configured as an inclined surface that is inclined downward toward an axial center side of the wafer chuck.

In this case, even if the wafer chuck is significantly deviated from the suitable position when it is separated from the lower surface of the measurement unit, the lowered wafer chuck abuts the inclined centering surface and is guided by the centering surface to the vicinity of the suitable position. As a result, when the falling restriction claws are displaced to the advanced position, the wafer chuck is reliably centered by the centering surface.

According to the prober of the present invention, even after the wafer chuck has separated from the lower surface of the measurement unit and been temporarily held by the falling restriction mechanism, the wafer chuck can be transferred to the alignment device in the suitable position.

DETAILED DESCRIPTION OF THE INVENTION

Figure 1:
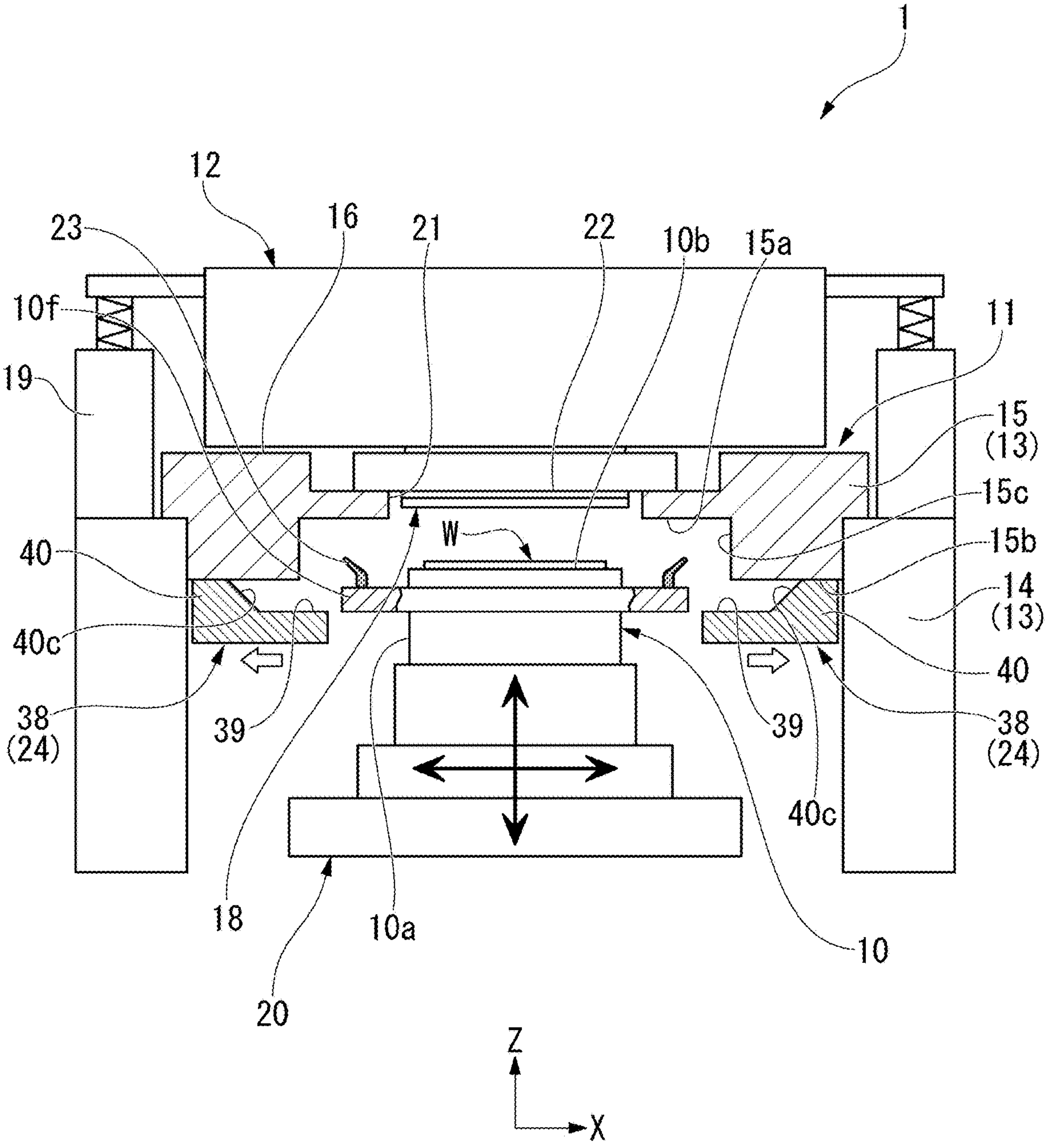
FIG. 1 is a partial cross-sectional front view showing a state before a wafer chuck of a wafer inspection device of an embodiment is mounted.

An embodiment of the present invention will be described below with reference to the drawings.

Also, in the drawings, X, Y, and Z arrows indicating a Cartesian coordinate system are shown at suitable positions. In the Cartesian coordinate system, the Z arrow points vertically upward, the X arrow points in a direction perpendicular to the Z direction, and the Y arrow points in a direction perpendicular to the Z direction and the X direction.

FIG. 1 is a partial cross-sectional front view of a wafer inspection device 1 according to an embodiment.

The wafer inspection device 1 forms part of a system for performing wafer-level inspection. The wafer inspection device 1 includes a prober 11 that brings probes into contact with electrodes of each chip on a wafer W, and a test head 12 that is electrically connected to the probes and supplies a power supply current and a test signal to each chip to measure signals output from each chip. The test head 12 is a device for performing electrical inspection of each chip, and determines whether or not the chips operate normally on the basis of measured values of the signals output from each chip.

A housing 13 of the wafer inspection device 1 has a side wall 14 and a ceiling wall 15. The ceiling wall 15 forms a head stage on which a plurality of measurement units 16 are disposed. The prober 11 is disposed in each measurement unit 16. In FIG. 1, only one measurement unit 16 is shown on the ceiling wall 15, but the plurality of measurement units 16 are arranged in a row on the ceiling wall 15 of the housing 13.

The prober 11 includes a probe card 18 that has a plurality of probes (not shown) corresponding to the electrodes of each chip on the wafer W, a wafer chuck 10 that holds the wafer W on its upper surface, and an alignment device 20 that detachably holds the wafer chuck 10 and aligns the wafer W with the probe card 18 via the wafer chuck 10. Each measurement unit 16 can simultaneously inspect all chips on the wafer W held by the wafer chuck 10. The alignment device 20 can be moved between the plurality of measurement units 16 by a moving device (not shown). One alignment device 20 is shared by the plurality of probers 11.

In addition, the test head 12 corresponding to each measurement unit 16 is attached to an upper part of the housing 13 via a support wall 19.

The ceiling wall 15 (head stage) of the housing 13 is provided with a card mounting portion 21 (mounting hole) for each measurement unit 16. Each card mounting portion 21 has a replaceable probe card 18 disposed therein. The probe card 18 is detachably attached to a lower surface of the corresponding test head 12 via a contactor 22. Each probe of the probe card 18 is electrically connected to a base in the test head 12 via the contactor 22. The wafer W serving as an inspection target, which is held by the wafer chuck 10, is placed to overlap a lower surface side of the probe card 18 in a pressed state.

The wafer chuck 10 is formed in a cylindrical shape with a short axis as a whole, and a ring-shaped flange wall **10*f* is provided to protrude at a position near an upper side of an outer circumferential surface of a body portion 10*a*. A central region of an upper surface of the body portion 10*a* is a placing surface 10*b* on which the wafer W is placed. Also, when the wafer W is placed on the placing surface 10*b*, the wafer W is positioned concentrically with the wafer chuck 10 by a positioning unit (not shown). A first suction port connected to a suction device (not shown) is formed in the placing surface 10*b*. When a vacuum suction is performed through the first suction port with the wafer W placed on the placing surface 10*b*, the wafer W is fixed by suction to the placing surface 10*b*. Thus, the wafer W can move and stop integrally with the wafer chuck 10**.

However, the means for fixing the wafer W to the placing surface **10*b* is not limited to attachment by vacuum suction, and the wafer W may be fixed to the placing surface 10*b*** by a mechanical mechanism.

The wafer chuck 10 is detachably held on an upper portion of the alignment device 20 and can be moved in the X, Y, Z, and θ directions by the alignment device 20. Also, between a lower end of the body portion **10*a* of the wafer chuck 10 and a chuck holding portion of the alignment device 20**, an engagement portion (not shown) is provided to fix relative positions of the two.

In addition, a sealing mechanism is provided on an upper portion of the wafer chuck 10. The sealing mechanism includes a ring-shaped seal member 23 attached to the vicinity of an outer circumferential edge portion of the upper surface of the wafer chuck 10, a second suction port (not shown) provided at a position away from the placing surface **10*b* of the wafer chuck 10, and a suction device (not shown) connected to the second suction port. The second suction port is disposed at a position facing an inner circumferential side (radially inner side) of the ring-shaped seal member 23**.

When the wafer chuck 10 is pushed upward by a lifting unit of the alignment device 20 while held by the alignment device 20, the ring-shaped seal member 23 comes into contact with a lower surface of the ceiling wall 15 in a circumferential region of the probe card 18. The portion of the lower surface of the ceiling wall 15 with which the ring-shaped seal member 23 comes into contact will be referred to as a "chuck attachment surface **15*a*.**"

In this state, when vacuum suction is performed through the second suction port, an internal space S (see FIG. 6) sealed by the ring-shaped seal member 23 is depressurized, and the wafer chuck 10 is drawn toward the ceiling wall 15 (probe card 18). As a result, an upper surface of the wafer W disposed on the wafer chuck 10 is pressed against the probe card 18, and the plurality of probes of the probe card 18 are brought into contact with and connected to the corresponding electrodes on the wafer W. The chuck holding portion of the alignment device 20 then retracts downward.

Also, in the present embodiment, the ring-shaped seal member 23 is configured to come into contact with the lower surface of the ceiling wall 15, but the ring-shaped seal member 23 may be configured to come into contact with a circumferential edge of the lower surface of the probe card 18.

The chuck attachment surface **15*a* on the lower surface of the ceiling wall 15 is formed to be recessed upward in a circular shape with respect to its outer region. Hereinafter, the outer region of the chuck attachment surface 15*a* on the lower surface of the ceiling wall 15 will be referred to as an "outer lower surface 15*b*," and the portion recessed upward between the outer lower surface 15*b* and the chuck attachment surface 15*a* will be referred to as a "chuck accommodating portion 15*c*." The outer lower surface 15*b* of the ceiling wall 15 is provided with a plurality of falling restriction mechanisms 24 that restrict falling of the wafer chuck 10 from the lower surface of the ceiling wall 15 (measurement unit 16). The detailed structure of the falling restriction mechanism 24** will be described later.

Figure 2:
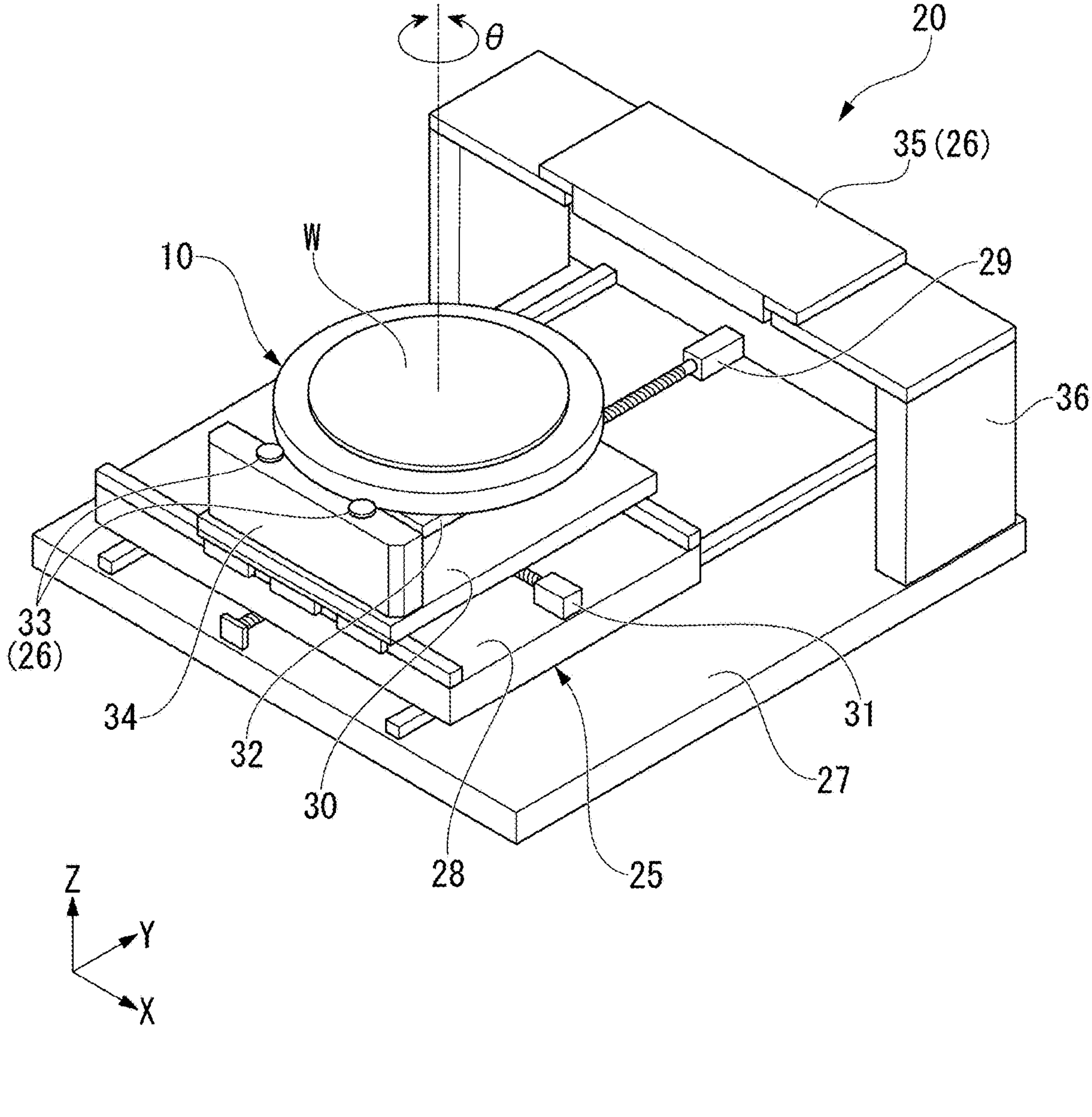
FIG. 2 is a perspective view showing a schematic configuration of an alignment device of the embodiment.

FIG. 2 is a perspective view showing a schematic configuration of the alignment device 20. In addition, FIG. 2 shows a state in which the wafer chuck 10 is held on the upper portion of the alignment device 20.

The alignment device 20 includes a moving and rotating mechanism 25 that moves the wafer chuck 10 in the X, Y, Z, and θ directions, and an alignment mechanism 26 that detects a relative positional relationship between the electrodes of each chip of the wafer W held on the wafer chuck 10 and the corresponding probes on the probe card 18. The alignment device 20 detects the relative positional relationship between the electrodes of each chip of the wafer W held on the wafer chuck 10 and the probes on the probe card 18 using the alignment mechanism 26, and on the basis of the detection results, the moving and rotating mechanism 25 moves the wafer chuck 10 so that the electrodes of each chip come into contact with the probes.

The alignment device 20 includes a base table 27 connected to a moving device (not shown). The moving device moves between the plurality of measurement units 16 by an operation of an actuator (not shown). A Y axis moving table 28 that can move in the Y axis direction is supported on the base table 27. The Y axis moving table 28 can be moved to any position in the Y axis direction by a Y axis actuator 29 using a ball screw and a motor, or the like. An X axis moving table 30 that can move in the X axis direction is supported on the Y axis moving table 28. The X axis moving table 30 can be moved to any position in the X axis direction by an X axis actuator 31 using a ball screw and a motor, or the like. A Z axis moving and rotating unit 32 having a chuck holding portion (not shown) on its upper portion is provided on the X axis moving table 30. The wafer chuck 10 is detachably held on the chuck holding portion.

The moving and rotating mechanism 25 is configured of the Z axis moving and rotating unit 32, the X axis moving table 30, the Y axis moving table 28, and the like.

A probe position detection camera 33 is provided on the upper portion of the X axis moving table 30 via a camera moving mechanism 34. The probe position detection camera 33 detects positions of the probes on the probe card 18 at a position below the measurement unit 16. In addition, an alignment camera 35 is provided on the base table 27 via a support column 36. An imaging unit of the alignment camera 35 is disposed to face downward. The alignment camera 35 detects positions of the electrodes of each chip on the wafer W when the wafer chuck 10 holding the wafer W is moved below the imaging unit by an operation of the Y axis moving table 28. Output units of the probe position detection camera 33 and the alignment camera 35 are connected to an image processing unit (not shown). The moving and rotating mechanism 25 adjusts the position of the wafer chuck 10 (wafer W) on the basis of image information detected by the probe position detection camera 33 and the alignment camera 35.

The alignment mechanism 26 is configured of the probe position detection camera 33, the alignment camera 35, the image processing unit, and the like.

Next, the falling restriction mechanisms 24 will be described.

Figure 3:
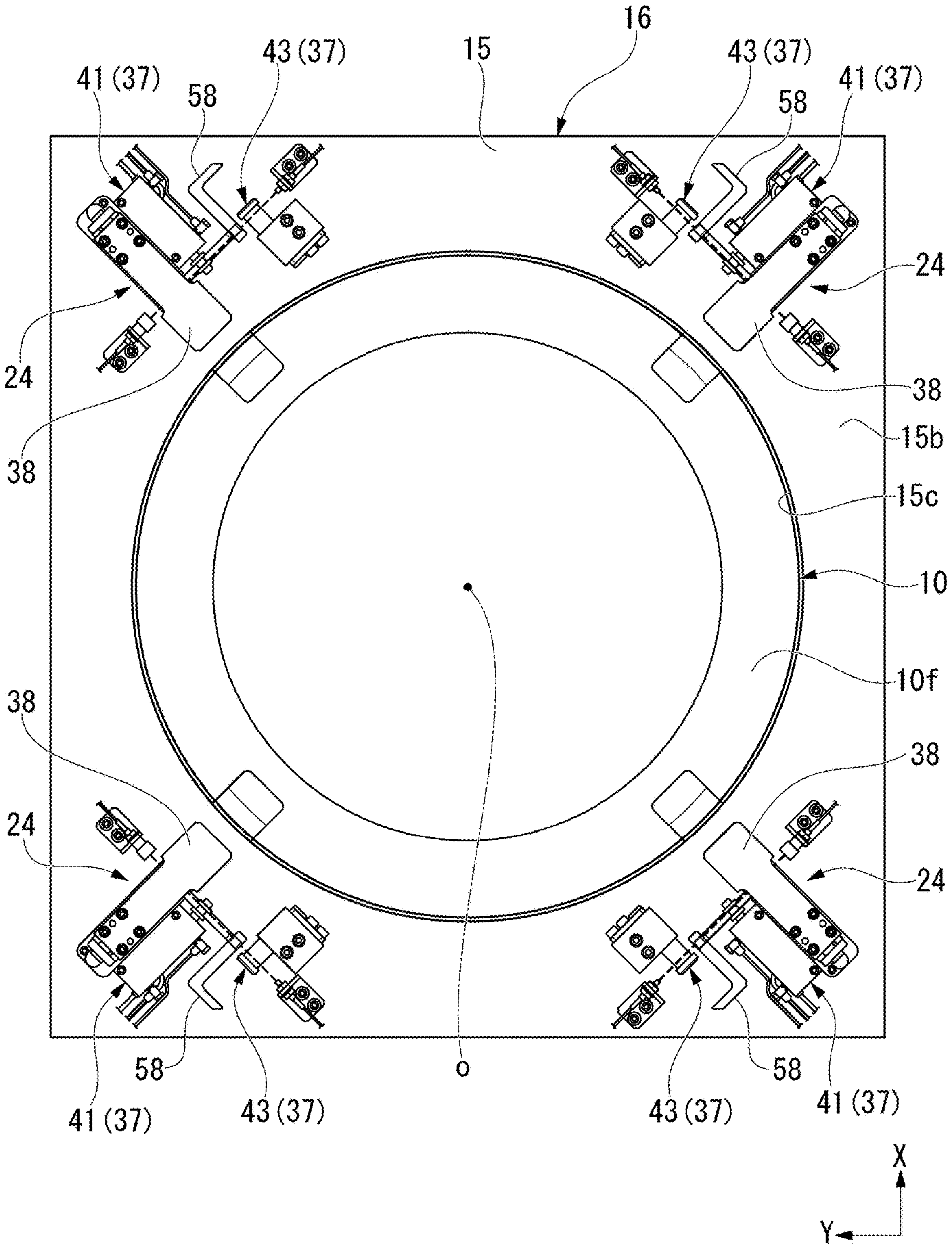
FIG. 3 is a bottom view of a measurement unit and the wafer chuck of the embodiment.
Figure 4:
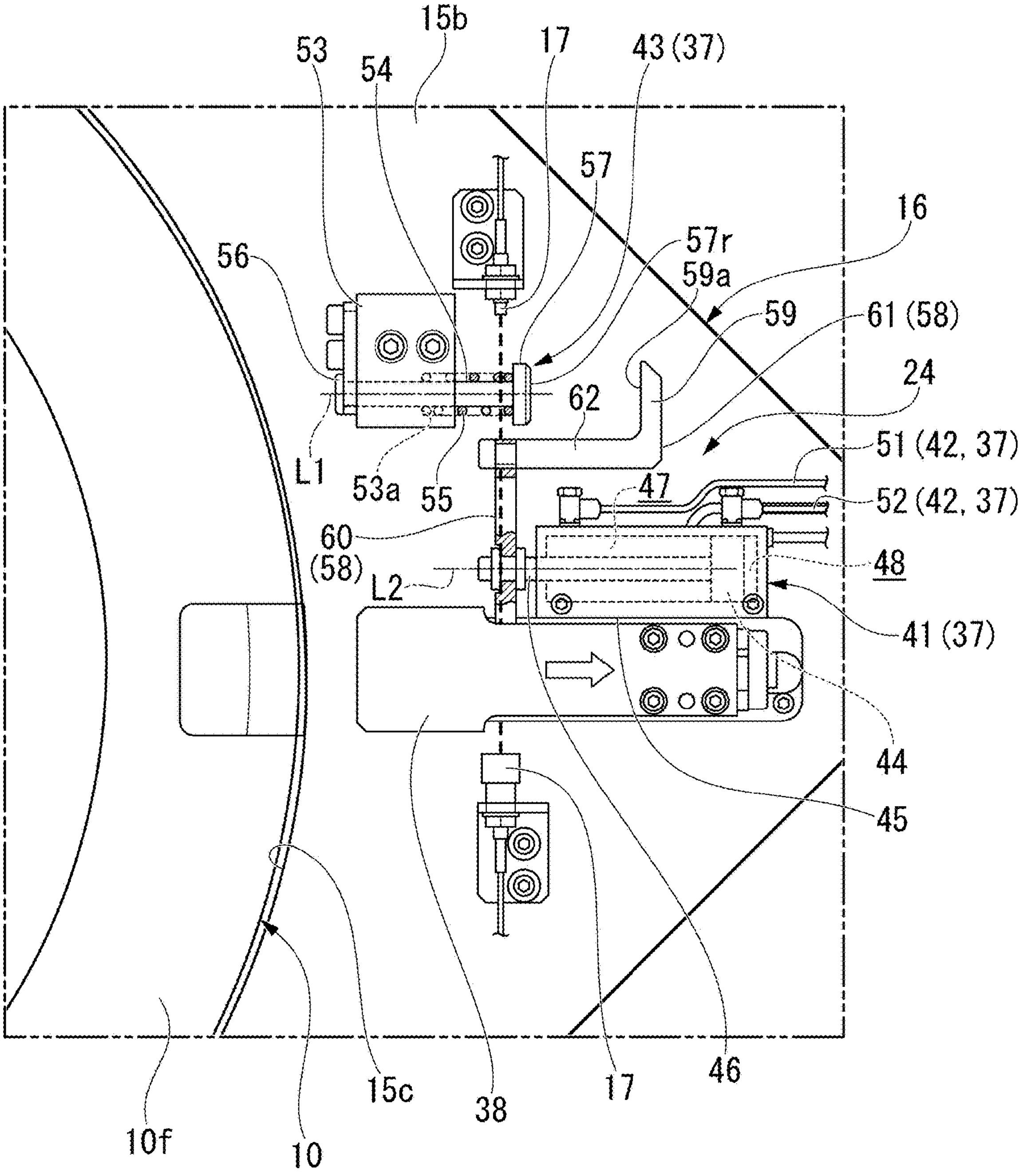
FIG. 4 is an enlarged view of a part of FIG. 3 when a falling restriction claw is in a retracted position.
Figure 5:
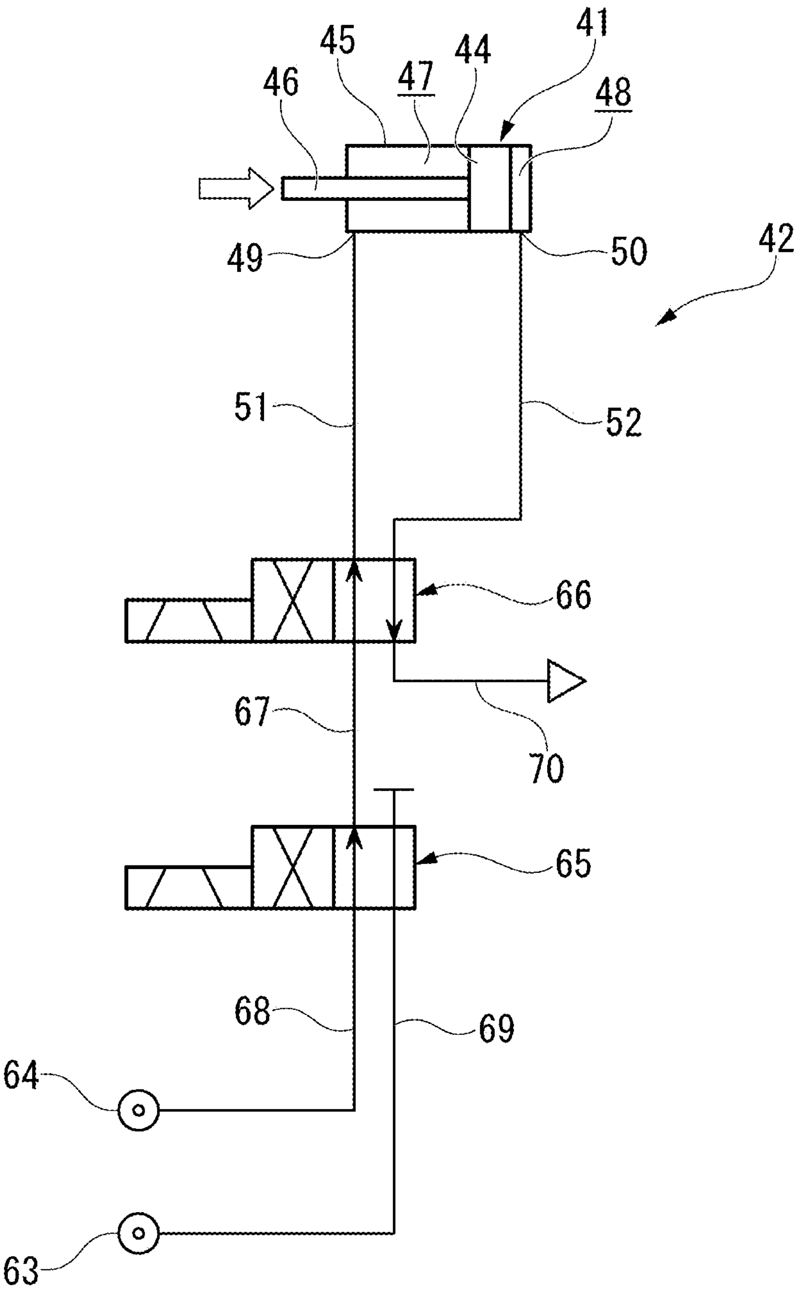
FIG. 5 is a circuit diagram of a fluid control unit showing a state when a three position control device of the embodiment performs control for bringing the falling restriction claw to the retracted position.

FIG. 3 is a bottom view of the measurement unit 16 and the wafer chuck 10, and FIG. 4 is an enlarged view of a part of FIG. 3. FIG. 5 is a circuit diagram showing a fluid control unit 42 of a three position control device 37 (position control device) used in each falling restriction mechanism 24.

As shown in FIG. 3, in the present embodiment, four falling restriction mechanisms 24 are provided in the circumferential region of the chuck accommodating portion 15*c* on the lower surface of the ceiling wall 15 of the measurement unit 16. The four falling restriction mechanisms 24 are disposed at 90 degrees intervals in the circumferential region of the chuck accommodating portion 15*c*. All four falling restriction mechanisms 24 have the same configuration. As shown in FIGS. 3 and 4, each of the falling restriction mechanisms 24 includes a falling restriction claw 38 provided on the outer lower surface 15*b* of the ceiling wall 15 to be advanceable and retractable, and the three position control device 37 that controls advanced and retracted positions of the falling restriction claw 38.

Also, in the present embodiment, four falling restriction mechanisms 24 are provided in the circumferential region of the chuck accommodating portion 15*c*, but the number of falling restriction mechanisms 24 installed is not limited to four. The number of falling restriction mechanisms 24 installed may be two or more. However, from the viewpoint of efficient centering of the wafer chuck 10 as described later, the number is preferably three or more. In addition, when the number of falling restriction mechanisms 24 installed is two, the two falling restriction mechanisms 24 are preferably disposed at positions that are point symmetrical with respect to an axial center position o of the wafer chuck 10.

The falling restriction claw 38 is attached to the outer lower surface 15*b* of the ceiling wall 15 to advance and retract to move in a radial direction of the circular chuck accommodating portion 15*c* of the ceiling wall 15. An outer circumferential edge portion of the flange wall 10*f* of the wafer chuck 10 accommodated in the chuck accommodating portion 15*c* is formed in a circular shape in a plan view. For this reason, it can be said that the falling restriction claws 38 advance and retract to move in the radial direction of the wafer chuck 10.

Hereinafter, in the advanced and retracted positions of the falling restriction claw 38, the side that is close to the axial center position o of the wafer chuck 10 will be referred to as the "front," and the opposite side will be referred to as the "rear." The falling restriction claw 38 can be displaced to and stopped at three positions, a retracted position, an intermediate position, and an advanced position, by position control of the three position control device 37.

The retracted position is a position at which the falling restriction claw 38 retracts to the maximum extent. When the falling restriction claw 38 is at the retracted position, a tip portion of the falling restriction claw 38 is located at a radially outward position from the chuck accommodating portion 15*c*. In this state, the wafer chuck 10 can be displaced in and out of the chuck accommodating portion 15*c* in a vertical direction. That is, the wafer chuck 10 is allowed to pass between the plurality of falling restriction claws 38 in the vertical direction.

The intermediate position is a position between the retracted position and the advanced position. When the falling restriction claw 38 is at the intermediate position, the tip portion of the falling restriction claw 38 is located at a position at which it protrudes a predetermined amount radially inward from the chuck accommodating portion 15*c*. In this state, when the wafer chuck 10 fixed by suction to the lower surface of the measurement unit 16 is separated from the measurement unit 16 due to the power being turned off or other reasons, the wafer chuck 10 can be received from below (see FIG. 9).

Also, the advanced position is a position at which the falling restriction claw 38 is advanced forward to the maximum extent. When the falling restriction claw 38 is at the advanced position, the tip portion of the falling restriction claw 38 is located at a position at which it protrudes further radially inward from the chuck accommodating portion 15*c*. In this state, the falling restriction claw 38 comes into contact with the outer circumferential edge portion of the wafer chuck 10, and the position of the wafer chuck 10 can be corrected to a specified centering position.

When the upper portion of the wafer chuck 10 is disposed in the chuck accommodating portion 15*c*, the falling restriction claw 38 includes a support surface 39 (see FIG. 1) that is able to support a lower surface of the outer circumferential edge portion of the wafer chuck 10 (flange wall 10*f*), and a restriction wall 40 (see FIG. 1) rising upward from an end portion of the support surface 39 on a side away from the axial center position o of the wafer chuck 10. The support surface 39 is a flat surface facing upward and formed horizontally. A surface of the restriction wall 40 facing the outer circumferential edge portion of the wafer chuck 10 when the upper portion of the wafer chuck 10 is disposed in the chuck accommodating portion 15*c* is formed as a centering surface 40*c* (see FIG. 1). When the falling restriction claw 38 is at the advanced position, the centering surface 40*c* abuts the outer circumferential edge portion of the wafer chuck 10, thereby centering the wafer chuck 10 with respect to the card mounting portion 21 of the ceiling wall 15.

The centering surface 40*c* of the falling restriction claw 38 is configured of an inclined surface that is inclined downward toward the axial center side of the wafer chuck 10. As for the inclination, the centering surface 40*c* may be a flat surface or a conical tapered surface.

As shown in FIG. 4, the three position control device 37 includes a cylinder device 41, a fluid control unit 42, and a displacement restriction device 43. The cylinder device 41 has a piston 44 that is linked to advance and retraction movements of the falling restriction claw 38 serving as a control target, and the piston 44 is displaceable to each of the retracted position, the intermediate position, and the advanced position by receiving a thrust of air serving as a working fluid. Also, the three positions of the piston 44, the retracted position, the intermediate position, and the advanced position, correspond to the retracted position, the intermediate position, and the advanced position, which are the advanced and retracted positions of the falling restriction claw 38 described above. The fluid control unit 42 controls supply and discharge of air for the cylinder device 41. The displacement restriction device 43 mechanically restricts a displacement of the piston 44 heading from the retracted position toward the advanced position to the intermediate position.

The cylinder device 41 includes a cylinder body 45 in which the piston 44 is accommodated to be advanceable and retractable, and a piston rod 46 that is connected to the piston 44 and penetrates an end wall on one end side of the cylinder body 45 in an axial direction thereof to protrude to the outside. The cylinder body 45 is fixedly installed on the outer lower surface 15*b* of the ceiling wall 15 parallel to the falling restriction claw 38. The cylinder body 45 is fixed to the outer lower surface 15*b* of the ceiling wall 15 so that advance and retraction directions of the piston 44 are parallel to advance and retraction directions of the falling restriction claw 38. With respect to the cylinder device 41, the side at which the piston rod 46 protrudes from the cylinder body 45 will be referred to as the “front,” and the opposite side will be referred to as the “rear.” The front and rear of the cylinder device 41 coincide with the front and rear of the falling restriction claw 38.

The cylinder body 45 is formed in a sealed cylindrical container shape. The inside of the cylinder body 45 is separated by the piston 44 into a first air chamber 47 (first fluid chamber) and a second air chamber 48 (second fluid chamber). The first air chamber 47 is a chamber located on the front side of the piston 44, and when air serving as the working fluid is introduced into the first air chamber 47, the pressure of the introduced air presses the piston 44 in the retraction direction. The second air chamber 48 is a chamber located on the rear side of the piston 44, and when air serving as the working fluid is introduced into the second air chamber 48, the pressure of the introduced air presses the piston 44 in the advance direction.

As shown in FIG. 5, a first port 49 communicating with the first air chamber 47 and a second port 50 communicating with the second air chamber 48 are formed in the cylinder body 45. The first port 49 is connected to a first in and out passage 51 (in and out piping) of a fluid control circuit forming the fluid control unit 42. The second port 50 is connected to a second in and out passage 52 (in and out piping) of the fluid control circuit. In the case of the retraction movement of the piston 44, air at a predetermined pressure is introduced into the first air chamber 47 through the first in and out passage 51, and air in the second air chamber 48 is discharged to the outside through the second in and out passage 52. Also, in the case of the advance movement of the piston 44, air at a first operating pressure (to be described later) or a second operating pressure that is higher than the first operating pressure is introduced into the second air chamber 48 through the second in and out passage 52, and air in the first air chamber 47 is discharged to the outside through the first in and out passage 51. In addition, the pressure of the air (first operating pressure and second operating pressure) introduced into the second air chamber 48 in the case of the advance movement of the piston 44 is switched depending on an operating position of the piston 44. A specific configuration of the fluid control circuit (fluid control unit 42) will be described in detail later.

As shown in FIG. 4, the displacement restriction device 43 includes a base block 53 fixed to the outer lower surface 15*b* of the ceiling wall 15, an operating rod 54 supported by the base block 53 to be advanceable and retractable, and a spring member 55 that biases the operating rod 54 toward one end side in an axial direction thereof. The base block 53 supports the operating rod 54 slidably via a thrust bearing (not shown). The operating rod 54 penetrates the base block 53 in a front to rear direction. The base block 53 is fixed to the outer lower surface 15*b* of the ceiling wall 15 so that an axis L1 of the operating rod 54 is parallel to an axis L2 of the piston rod 46 of the cylinder device 41.

The falling restriction claw 38, the cylinder device 41, and the displacement restriction device 43 are arranged in a row so that they are parallel to each other. Here, when a direction orthogonal to the advance and retraction directions of the falling restriction claw 38 and the vertical direction is referred to as a “width direction” in the three position control device 37, the falling restriction claw 38, the cylinder device 41, and the displacement restriction device 43 are arranged in order in the width direction. That is, the falling restriction claw 38 is disposed on one side of the cylinder device 41 in the width direction, and the displacement restriction device 43 is disposed on the other side of the cylinder device 41 in the width direction.

Hereinafter, for the displacement restriction device 43, the same side as the front side of the falling restriction claw 38 or the piston 44 will be referred to as the “front,” and the same side as the rear side of the falling restriction claw 38 or the piston 44 will be referred to as the “rear.”

The operating rod 54 of the displacement restriction device 43 is provided with a slip-out restriction flange 56 at its front end portion and a load receiving flange 57 at its rear end portion. The slip-out restriction flange 56 is disposed on the front side of the base block 53, and the load receiving flange 57 is disposed on the rear side of the base block 53. Outer diameters of the slip-out restriction flange 56 and the load receiving flange 57 are greater than an outer diameter of a middle part of the operating rod 54. The slip-out restriction flange 56 abuts a front end face of the base block 53 to restrict slip-out of the operating rod 54 toward the rear side. A spring member 55 (coil spring) serving as a biasing means is disposed on an outer circumferential side of a rear region of the operating rod 54. A front end portion of the spring member 55 abuts a spring receiving portion 53*a* provided to be recessed in the rear end face of the base block 53, and the other end portion abuts a front surface side of the load receiving flange 57. Also, in the present embodiment, a compression spring is used for the spring member 55.

The load receiving flange 57 is biased rearward by the spring member 55. The spring member 55 is disposed between the spring receiving portion 53*a* and the load receiving flange 57 while compressed in advance by a predetermined amount. Thus, in a state in which the slip-out restriction flange 56 on the front end side of the operating rod 54 abuts the front end face of the base block 53, a preload is applied to the spring member 55 from the spring receiving portion 53*a* and the load receiving flange 57. This preload becomes an initial load at which the spring member 55 starts to undergo compression deformation (spring deformation) when an external force directed forward is applied to a rear end face 57*r* of the load receiving flange 57. Accordingly, a predetermined initial load is applied to the spring member 55 set in the displacement restriction device 43. This initial load will be described in detail later.

The rear end face 57*r* of the load receiving flange 57 is a load receiving portion that receives a load of the piston 44 moving toward the advanced position when the piston 44 of the cylinder device 41 is displaced from the retracted position to the intermediate position.

Also, the load receiving flange 57 may be biased by an air cylinder instead of the spring member 55.

A load transmission arm 58 capable of transmitting a load acting on the piston rod 46 from the piston 44 to the rear end face 57*r* of the load receiving flange 57 is connected to a front end portion of the piston rod 46 of the cylinder device 41. The rear end face 57*r* of the load receiving flange 57 serving as the load receiving portion is located at a position (see FIG. 7) at which a front surface 59*a* of a pressing claw 59 of the load transmission arm 58, which will be described later, abuts from the rear side when the piston 44 is displaced from the retracted position to the intermediate position.

The load transmission arm 58 is connected to the front end portion of the piston rod 46 that protrudes forward from the cylinder body 45. The load transmission arm 58 is configured of a base rod 60 that extends linearly below the outer lower surface 15*b* in a direction orthogonal to an extending direction of the piston rod 46, and an L-shaped rod 61 that is connected to an end portion of the base rod 60 and has a substantially L-shape in a front view. An end portion of the base rod 60 on a side opposite to the connection portion of the base rod 60 with the L-shaped rod 61 is connected to a side surface of the falling restriction claw 38. Accordingly, the piston 44 of the cylinder device 41 and the falling restriction claw 38 are connected to be movable in conjunction with each other via the piston rod 46 and the base rod 60.

Although the cylinder device 41 has been described as a cylinder having the piston rod 46, a rodless cylinder may also be used. In that case, it is sufficient to connect a member that moves in conjunction with a piston of the rodless cylinder to the load transmission arm 58.

The L-shaped rod 61 has a rear offset portion 62 that extends rearward from the connection portion with the base rod 60, and a pressing claw 59 that bends and extends from a rear end portion of the rear offset portion 62 to a side away from the falling restriction claw 38. The L-shaped rod 61 is disposed at a position at which it does not overlap the cylinder body 45 of the cylinder device 41 in the front to rear direction. In addition, an extension length of the rear offset portion 62 of the L-shaped rod 61 is set so that the pressing claw 59 can be displaced rearward from a front end face of the cylinder body 45 when the piston 44 of the cylinder device 41 is displaced rearward from the advanced position. The front surface 59*a* of the pressing claw 59 is disposed so that it can abut from the rear of the rear end face 57*r* of the load receiving flange 57, which is a load receiving surface of the displacement restriction device 43. When the piston 44 of the cylinder device 41 is displaced from the retracted position to the intermediate position (see FIG. 7), the pressing claw 59 abuts the rear end face 57*r* of the load receiving flange 57. In this case, the rear end face 57*r* serving as the load receiving portion receives the load of the piston 44 moving toward the advanced position.

In the present embodiment, since the rear offset portion 62 is provided on a part of the load transmission arm 58, it is possible to shorten the length in the front to rear direction from a front end portion of the displacement restriction device 43 to a rear end portion of the cylinder device 41. For this reason, each falling restriction mechanism 24 can be installed compactly in a limited installation space in the circumferential region of the chuck accommodating portion 15*c*.

Also, in FIG. 4, the reference numeral 17 denotes a position detection sensor for detecting that the falling restriction claw 38 is located at the intermediate position. For the position detection sensor 17, for example, a laser type position detection sensor having a light emitting unit and a light receiving unit can be used. Position information detected by the position detection sensor 17 is output to a control device (not shown) that controls each part of the device. In addition, the cylinder device 41 is provided with a position sensor (not shown) that detects that the piston 44 in the cylinder body 45 has reached the advanced position, and a position sensor (not shown) that detects that the piston 44 has reached the retracted position. Whether the falling restriction claw 38 is at the advanced or retracted position is detected on the basis of information from these two position sensors. This detection information is output to a control device (not shown).

Figure 8:
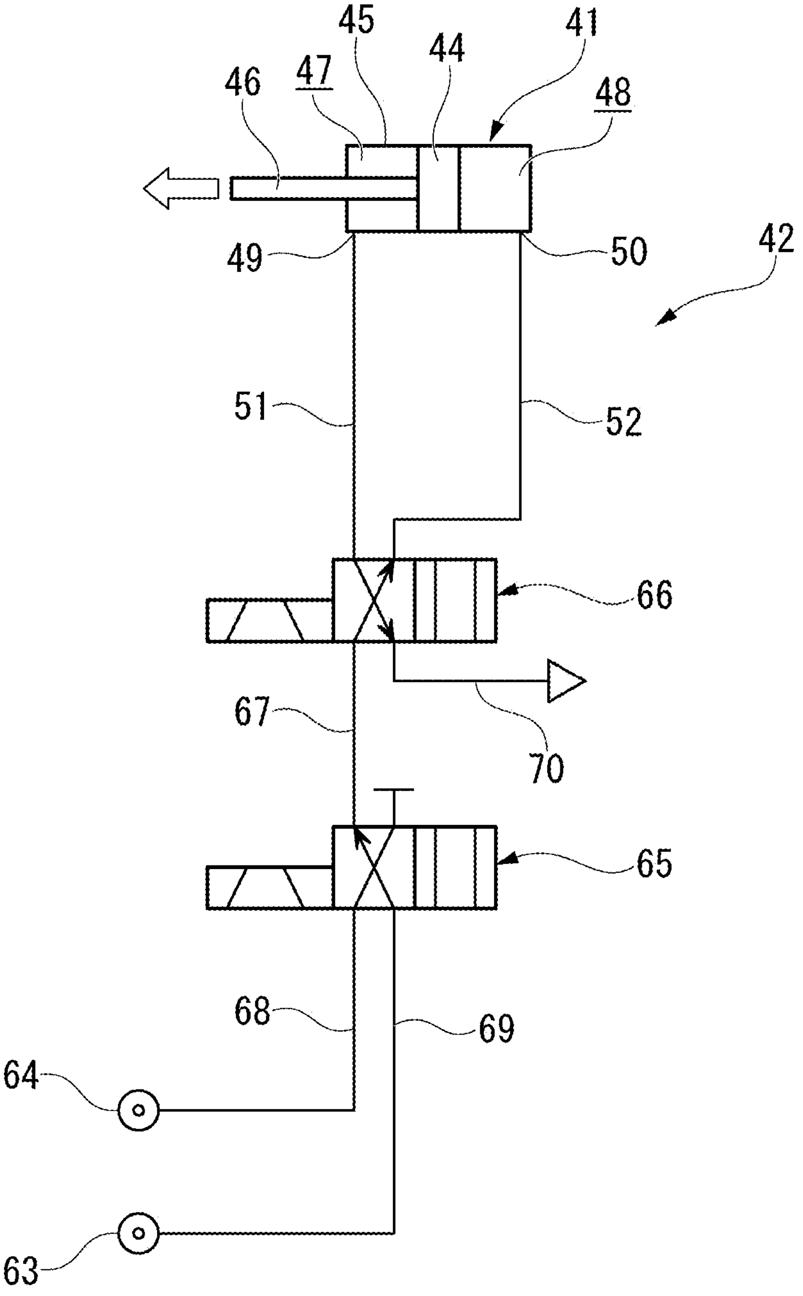
FIG. 8 is a circuit diagram of the fluid control unit showing a state when control for bringing the falling restriction claw to the intermediate position is performed.
Figure 12:
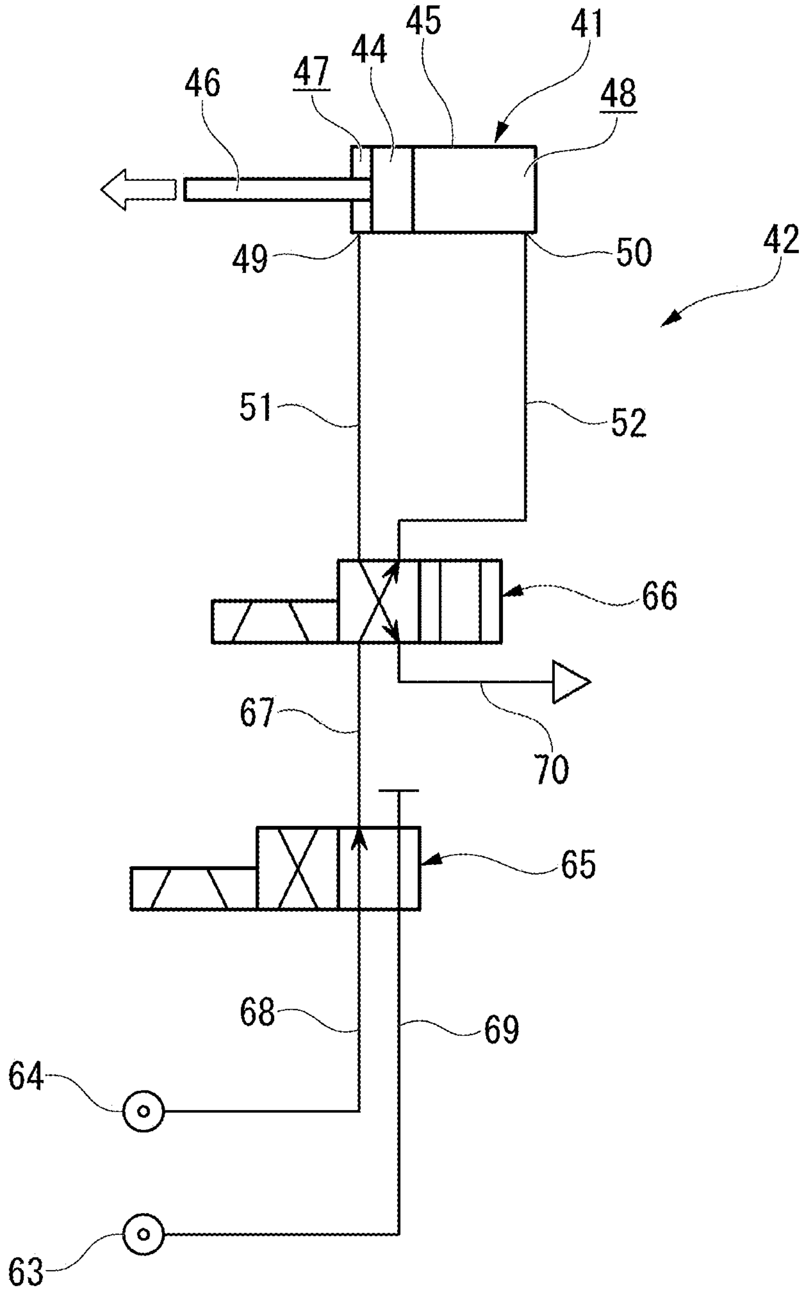
FIG. 12 is a circuit diagram of the fluid control unit showing a state when control for bringing the falling restriction claw to the advanced position is performed.

FIGS. 5, 8, and 12 are circuit diagrams of the fluid control unit 42. FIG. 5 shows a circuit state when control for bringing the falling restriction claw 38 to the retracted position is performed, and FIG. 8 shows a circuit state when control for bringing the falling restriction claw 38 from the retracted position to the intermediate position is performed. FIG. 12 shows a circuit state when control for bringing the falling restriction claw 38 from the intermediate position to the advanced position is performed.

As shown in these figures, the fluid control unit 42 includes a first pressure source 63 and a second pressure source 64 with different air pressures (operating pressures), a pressure switching valve 65 capable of selectively switching air supply from these pressure sources 63 and 64, and a flow passage switching valve 66 capable of selectively switching connection of a supply flow passage and a discharge flow passage of the air (working fluid) to the first air chamber 47 or the second air chamber 48 of the cylinder device 41.

The first pressure source 63 can supply a predetermined air pressure (hereinafter referred to as a "first operating pressure"), for example, 0.1 MPa. In contrast, the second pressure source 64 can supply an air pressure (hereinafter referred to as a "second operating pressure") higher than the first operating pressure, for example, 0.6 MPa.

The pressure switching valve 65 is disposed upstream from (on the pressure source side of) the flow passage switching valve 66 in the flow passage. The pressure switching valve 65 and the flow passage switching valve 66 are connected to each other by a relay passage 67. The pressure switching valve 65 can be switched between a first position (see FIGS. 5 and 12) at which an introduction passage 68 communicating with the high pressure second pressure source 64 is connected to the relay passage 67, and a second position (see FIG. 8) at which an introduction passage 69 communicating with the low pressure first pressure source 63 is connected to the relay passage 67. The pressure switching valve 65 is configured of, for example, a solenoid valve that can be switched between two positions. The solenoid of the pressure switching valve 65 is controlled by a control device (not shown).

In addition to the relay passage 67, the flow passage switching valve 66 is connected to the first in and out passage 51 that communicates with the first air chamber 47 of the cylinder device 41, the second in and out passage 52 that communicates with the second air chamber 48 of the cylinder device 41, and a discharge passage 70 for discharging air to the outside. The flow passage switching valve 66 can be switched between a first position (see FIG. 5) at which it connects the relay passage 67 to the first in and out passage 51 (first air chamber 47) and connects the second in and out passage 52 (second air chamber 48) to the discharge passage 70 and a second position (see FIGS. 8 and 12) at which it connects the relay passage 67 to the second in and out passage 52 (second air chamber 48) and connects the first in and out passage 51 (first air chamber 47) to the discharge passage 70. The flow passage switching valve 66 is configured of, for example, a solenoid valve that can be switched between two positions. The solenoid of the flow passage switching valve 66 is controlled by a control device (not shown).

The fluid control unit 42 can selectively switch a flow passage of the air (working fluid) to one of the following first, second, and third flow passages by controlling a combination of the pressure switching valve 65 and the flow passage switching valve 66.

First Flow Passage

A flow passage that introduces air at a high second operating pressure into the first air chamber 47 and discharges air from the second air chamber 48. This first flow passage is obtained by combining the operating states of the pressure switching valve 65 and the flow passage switching valve 66 shown in FIG. 5.

Second Flow Passage

A flow passage that introduces air at a low first operating pressure into the second air chamber 48 and discharges air from the first air chamber 47. This second flow passage is obtained by combining the operating states of the pressure switching valve 65 and the flow passage switching valve 66 shown in FIG. 8.

Third Flow Passage

A flow passage that introduces air at a high second operating pressure into the second air chamber 48 and discharges air from the first air chamber 47. This third flow passage is obtained by combining the operating states of the pressure switching valve 65 and the flow passage switching valve 66 shown in FIG. 12.

In the present embodiment, the pressure of the air introduced into the first air chamber 47 through the first flow passage is the same as the pressure (the second operating pressure) of the air introduced into the second air chamber 48 through the third flow passage, but, for example, if a pressure source with a different operating pressure is added and the switching positions of the pressure switching valve 65 are set to three positions, the pressure of the air introduced into the first air chamber 47 through the first flow passage can be a pressure different from the second operating pressure.

Here, the initial load of the spring member 55 of the displacement restriction device 43 described above is set to be greater than the thrust of the piston 44 when the air of the first operating pressure (low pressure) is introduced into the second air chamber 48 of the cylinder device 41 and smaller than the thrust of the piston 44 when the air of the second operating pressure (high pressure) is introduced into the second air chamber 48. In addition, an operating load of the spring member 55 (a load until it moves to the advanced position) is smaller than the thrust of the piston 44 when the air of the second operating pressure (high pressure) is introduced into the second air chamber 48. That is, a biasing force of the spring member 55 serving as a biasing means is set to be smaller than the thrust of the piston 44 when the air of the second operating pressure (high pressure) is introduced into the second air chamber 48.

The operating rod 54 of the displacement restriction device 43 biased in the retraction direction by the spring member 55, is maintained stopped in the intermediate position until the thrust of the piston 44 in the advance direction input through the load transmission arm 58 exceeds the initial load of the spring member 55. In this case, the piston 44 and the falling restriction claw 38 are maintained in the intermediate position together with the operating rod 54. On the other hand, when the thrust of the piston 44 in the advance direction input through the load transmission arm 58 becomes greater than the initial load of the spring member 55, the operating rod 54 displaces from the intermediate position toward the advanced position. In this case, the piston 44 and the falling restriction claw 38 displace from the intermediate position toward the advanced position together with the operating rod 54.

In addition, when the load receiving flange 57 is biased by an air cylinder instead of the spring member 55, the thrust of the air cylinder at an initial position may be set to be greater than the thrust of the piston 44 when the air of the first operating pressure (low pressure) is introduced into the second air chamber 48 of the cylinder device 41, and smaller than the thrust of the piston 44 when the air of the second operating pressure (high pressure) is introduced into the second air chamber 48.

Next, an inspection operation using the prober 11 of the present embodiment will be described.

Figure 6:
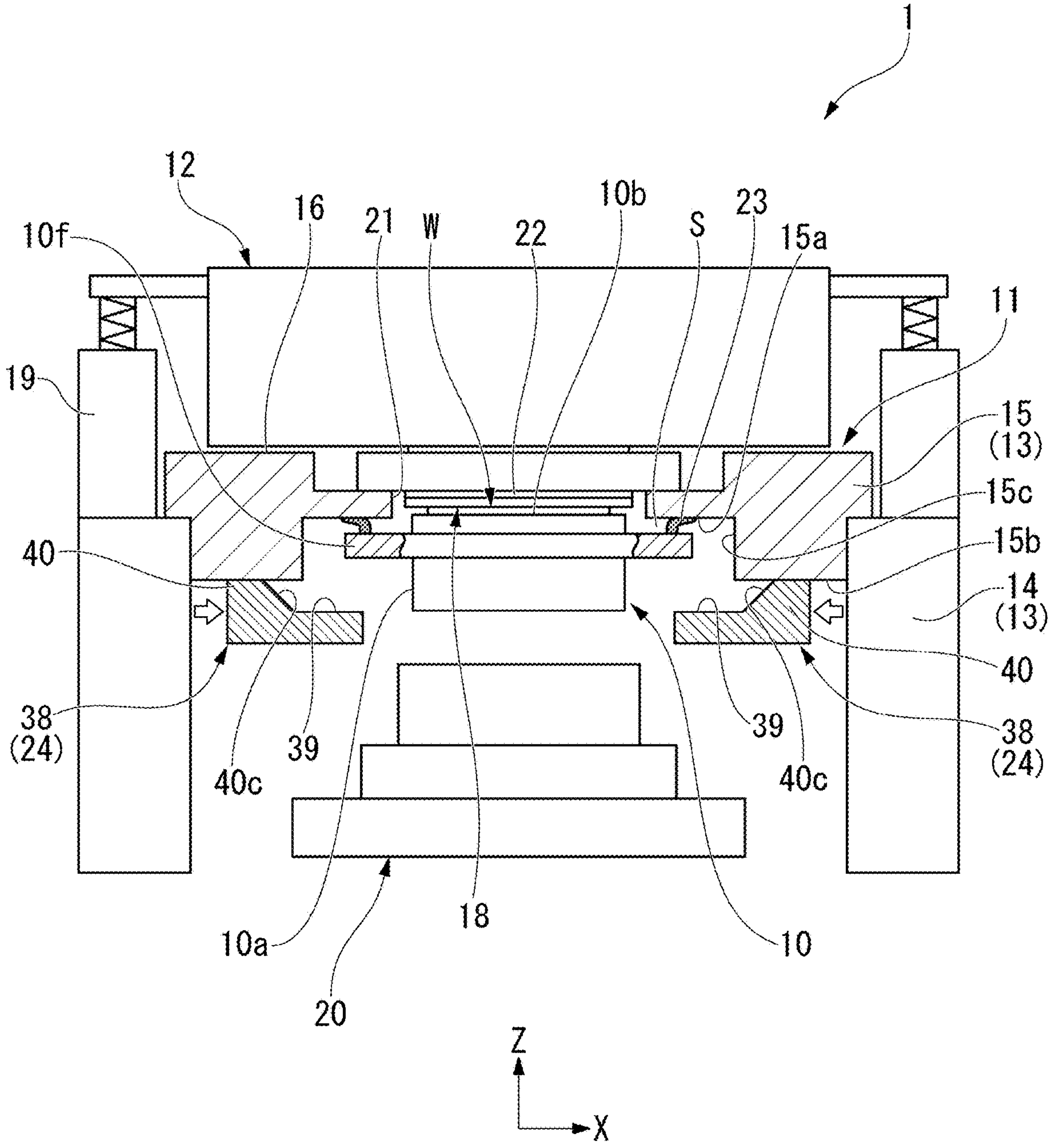
FIG. 6 is a partial cross-sectional front view showing a state before the wafer chuck of the wafer inspection device of the embodiment is attached.
Figure 7:
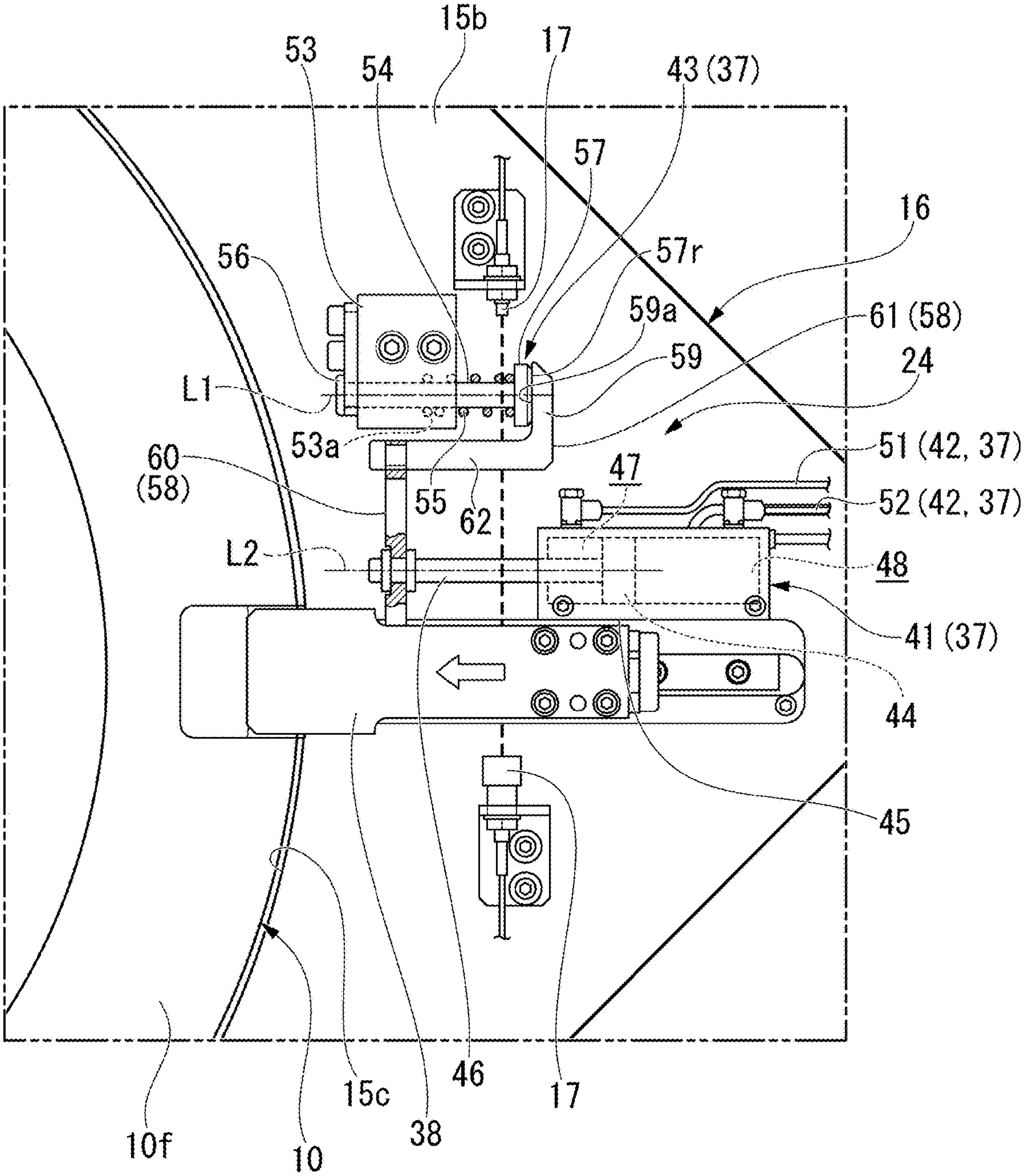
FIG. 7 is an enlarged view of a part of FIG. 3 when the falling restriction claw is in an intermediate position.
Figure 9:
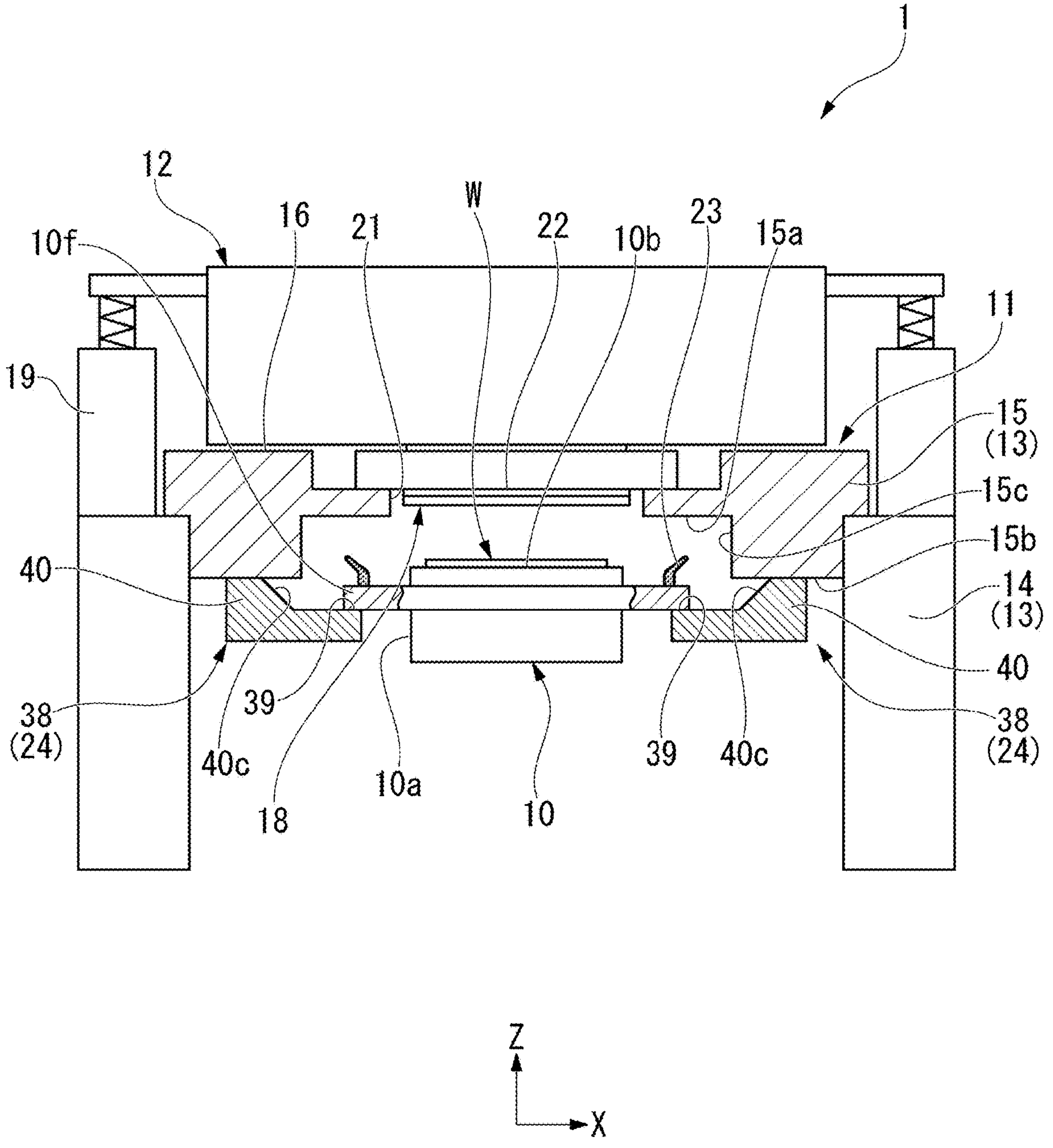
FIG. 9 is a partial cross-sectional front view showing a state in which falling of the wafer chuck of the wafer inspection device of the embodiment is restricted.
Figure 10:
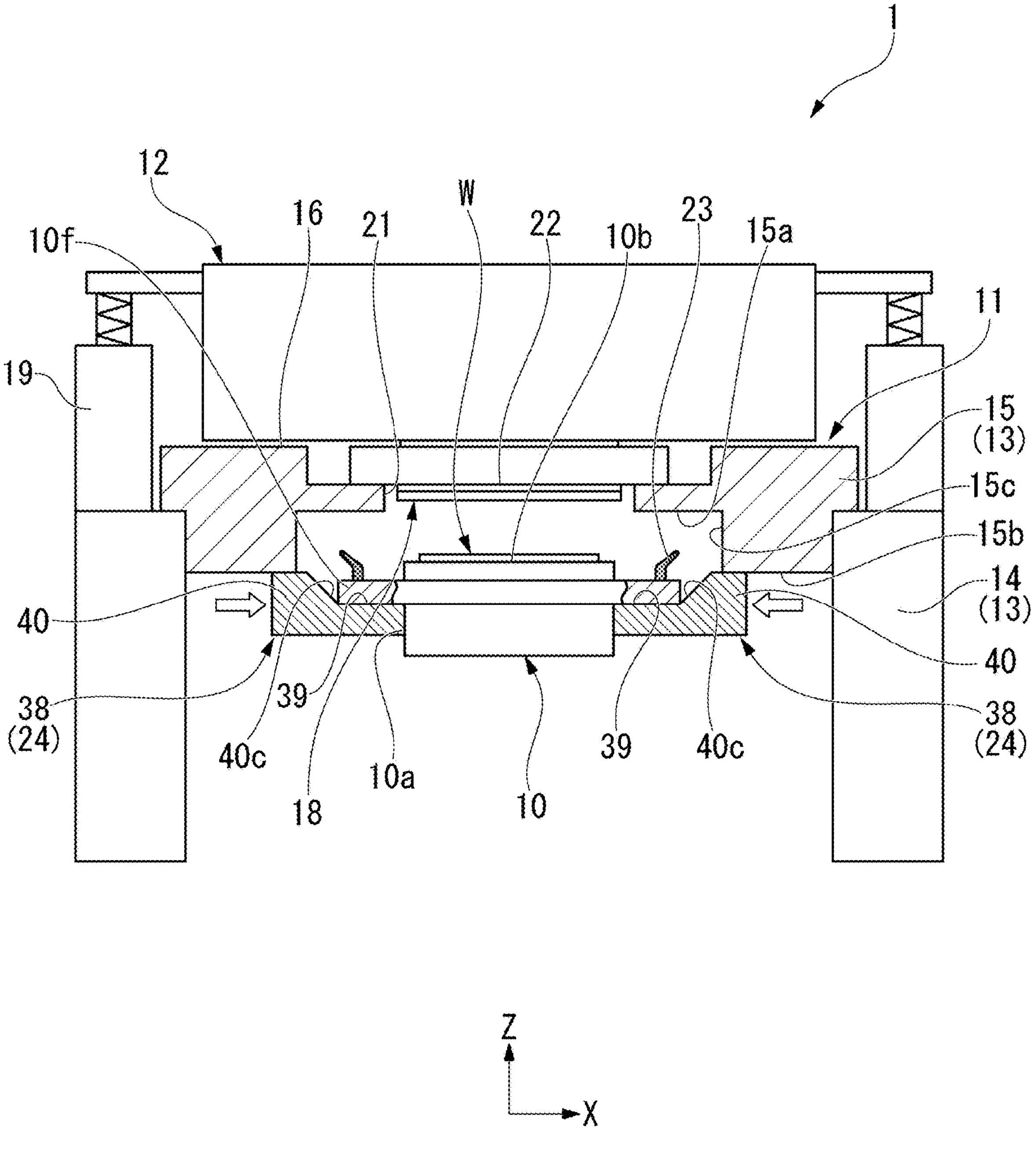
FIG. 10 is a partial cross-sectional front view showing a state in which the wafer chuck of the wafer inspection device of the embodiment is centered.
Figure 11:
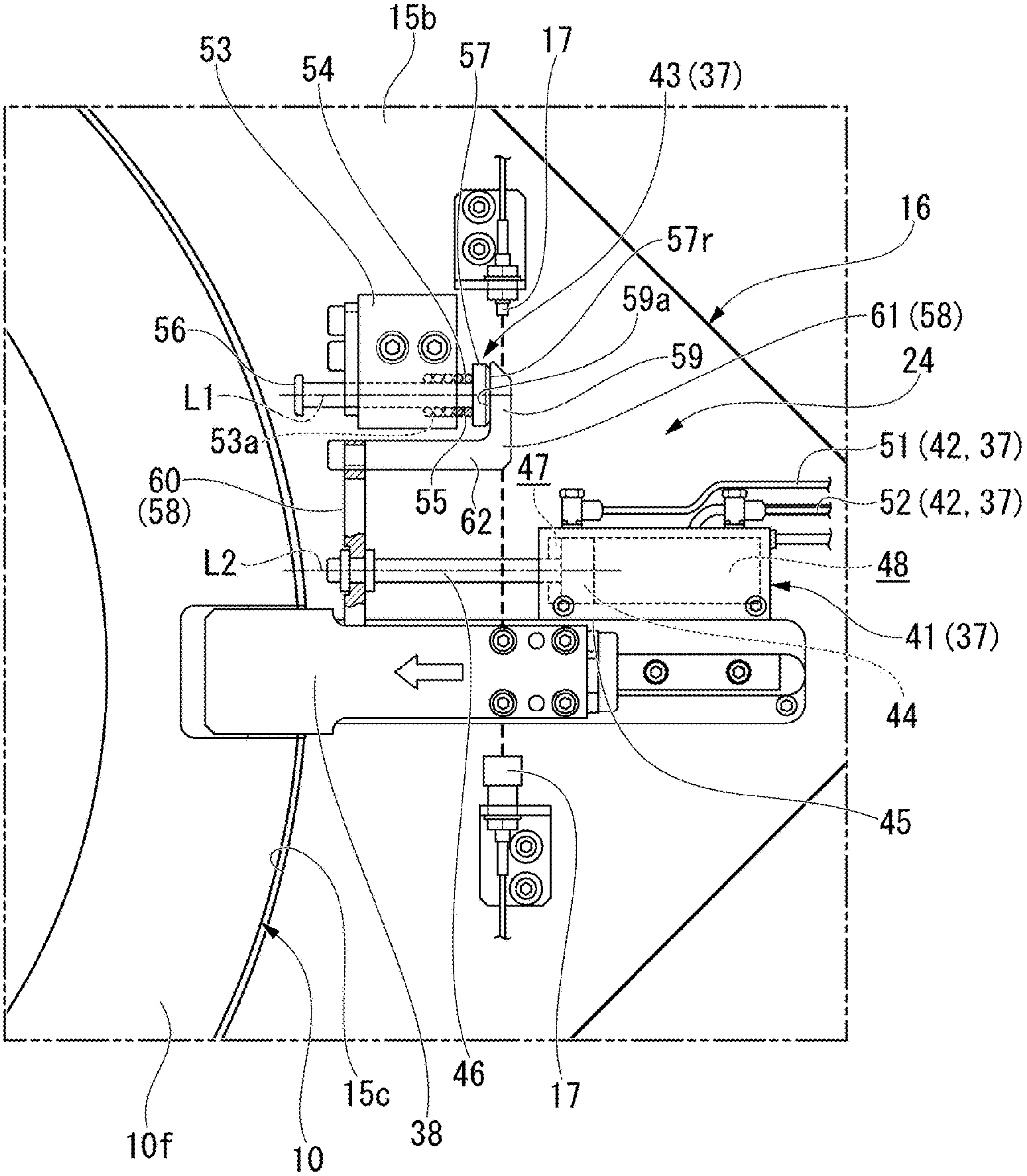
FIG. 11 is an enlarged view of a part of FIG. 3 when the falling restriction claw is in an advanced position.

FIGS. 6, 9, and 10 are partial cross-sectional front views of the wafer inspection device 1 similar to FIG. 1. FIG. 6 shows a state in which the wafer chuck 10 is fixed by suction to the lower surface of the ceiling wall 15 of the measurement unit 16, FIG. 9 shows a state in which the falling restriction claws 38 restrict falling of the wafer chuck 10, and FIG. 10 shows a state in which the falling restriction claws 38 center the wafer chuck 10. FIG. 7 is a diagram corresponding to FIG. 4 when the falling restriction claw 38 is in the intermediate position, and FIG. 11 is a diagram corresponding to FIG. 4 when the falling restriction claw 38 is in the advanced position.

In an initial state, as shown in FIG. 1, it is assumed that the wafer chuck 10 is held by the chuck holding portion of the upper portion of the alignment device 20 and the wafer W is placed on the placing surface 10*b* of the wafer chuck 10.

The alignment device 20 is moved by a moving device (not shown) to the measurement unit 16 at which the inspection is performed. In this state, the chuck holding portion of the upper portion of the alignment device 20 is maintained in a lowered state.

In this state, an alignment operation is performed. Specifically, the X axis moving table 30 is moved so that the probe position detection camera 33 shown in FIG. 2 is located below the probes of the probe card 18. Then, the camera moving mechanism 34 moves the probe position detection camera 33 in the Z axis direction to adjust the focus, and the probe position detection camera 33 detects tip positions of the probes on the probe card 18. Positions of tips of the probes in a horizontal plane (positions in the X and Y directions) are detected by camera coordinates, and positions in the vertical direction (positions in the Z direction) are detected on the basis of a focal position of the camera.

Also, the probe card 18 is usually provided with hundreds to thousands of probes. For this reason, the detection of the tip positions of the probes using the probe position detection camera 33 is usually performed only for specific probes, rather than for all probes.

Next, the X axis moving table 30 is moved so that the wafer W held by the wafer chuck 10 is located below the alignment camera 35. In this state, the positions of the electrodes of each chip of the wafer W are detected by the alignment camera 35. In this case, it is not necessary to detect the positions of all the electrodes of one chip, and it is sufficient to detect the positions of some of the electrodes. Also, in this case, it is not necessary to detect the electrodes for all chips on the wafer W, and it is sufficient to detect the electrodes of some chips.

Next, on the basis of the arrangement of the probes on the probe card 18 and the arrangement of the electrodes on the wafer W side detected as described above, the Z axis moving and rotating unit 32 adjusts the rotational position so that the arrangement direction of the probes coincides with the arrangement direction of the electrodes on the wafer W side. Then, the X axis actuator 31 and the Y axis actuator 29 adjust the positions in the X and Y directions of the wafer chuck 10 so that the electrodes of the chip to be inspected on the wafer W are located below the corresponding probes of the probe card 18. Then, the Z axis moving and rotating unit 32 raises the wafer chuck 10 in the Z axis direction.

In this case, each of the falling restriction claws 38 of the four falling restriction mechanisms 24 disposed on the lower surface of the ceiling wall 15 of the measurement unit 16 are located in the retracted position as shown in FIGS. 1 and 4.

The Z axis moving and rotating unit 32 stops raising the wafer chuck 10 when the electrodes of the chip on the wafer W reach a height at which they come into contact with the probes of the probe card 18. In this case, as shown in FIG. 6, the ring-shaped seal member 23 on the upper portion of the wafer chuck 10 comes into contact with the lower surface of the ceiling wall 15 (chuck attachment surface 15*a*) in the circumferential region of the probe card 18, and the sealed internal space S is formed between the lower surface of the ceiling wall 15 and the wafer chuck 10.

Then, the internal space S is evacuated into vacuum by operating a suction device (not shown). This reduces a pressure in the internal space, and the wafer chuck 10 is drawn toward the lower surface of the probe card 18. As a result, each probe of the probe card 18 comes into contact with the corresponding electrode on the wafer W with a uniform force.

When the wafer chuck 10 holding the wafer W is thus fixed by suction to the ceiling wall 15 of the measurement unit 16, the alignment device 20 lowers the chuck holding portion in the Z axis direction by operating the Z axis moving and rotating unit 32. Thus, the chuck holding portion of the alignment device 20 separates from the wafer chuck 10.

Then, under the control of the fluid control units 42 of the four falling restriction mechanisms 24, each falling restriction claw 38 is advanced to the intermediate position as shown in FIGS. 6 and 7. In this case, each fluid control unit 42 is switched from the state shown in FIG. 5 (a first flow passage state) to the state shown in FIG. 8 (a second flow passage state). As a result, low pressure (first fluid pressure) air is introduced into the second air chamber 48 of the cylinder device 41, and the air in the first air chamber 47 is discharged to the outside. In this case, when the piston 44 of the cylinder device 41 is displaced to the intermediate position by a thrust of the low pressure air, the load transmission arm 58 connected to the piston rod 46 abuts the rear end face 57*r* (load receiving portion) of the load receiving flange 57 of the displacement restriction device 43, as shown in FIG. 7. Thus, the piston 44 and the falling restriction claw 38 stop at the intermediate position.

In this case, the initial load of the spring member 55 acts on the load receiving flange 57, but this initial load is set to be greater than the thrust of the piston 44 when the air of the first operating pressure (low pressure) is introduced into the second air chamber 48. For this reason, even if the load transmission arm 58 abuts the rear end face 57*r* of the load receiving flange 57 by the thrust of the piston 44, the operating rod 54 does not displace forward. Accordingly, the falling restriction claw 38 is maintained in the specified intermediate position.

In this state, all the tip portions of the four falling restriction claws 38 protrude a predetermined amount inside the chuck accommodating portion 15*c*, and the flat support surface 39 of each falling restriction claw 38 is located below the flange wall 10*f* of the wafer chuck 10. As a result, even if the wafer chuck 10 separates from the lower surface of the ceiling wall 15 due to the power being turned off or other reasons, the support surface 39 of the falling restriction claw 38 can receive the wafer chuck 10.

When preparation for testing in the measurement unit 16 is thus completed, the test head 12 supplies a power supply current and a test signal to each chip on the wafer W. The test head 12 receives detection signals output from each chip on the wafer W and determines whether each chip operates normally on the basis of the detection signals.

After completing the inspection, the wafer W waits with the wafer chuck 10 attached by suction to the ceiling wall 15 until the alignment device 20 returns from the other measurement units 16.

When the alignment device 20 returns to the position below the wafer chuck 10, the alignment device 20 raises the chuck holding portion using the Z axis moving and rotating unit 32 and engages the chuck holding portion with the wafer chuck 10.

Then, each falling restriction claw 38 of the four falling restriction mechanisms 24 is displaced to the retracted position as shown in FIG. 4 under the control of the fluid control unit 42. In this case, as shown in FIG. 5, the fluid control unit 42 switches the flow passage and the air of the second operating pressure (high pressure) is introduced into the first air chamber 47 of the cylinder device 41, and the air in the second air chamber 48 is discharged to the outside.

Next, the reduced pressure in the internal space S between the wafer chuck 10 and the ceiling wall 15, which is sealed by the ring-shaped seal member 23, is released, and the wafer chuck 10 is separated from the lower surface of the ceiling wall 15. Thus, the wafer chuck 10 is transferred to the chuck holding portion of the alignment device 20.

Then, the alignment device 20 operates the Z axis moving and rotating unit 32 to lower the inspected wafer W together with the wafer chuck 10. The alignment device 20 then moves to a predetermined transfer position and unloads the inspected wafer W.

On the other hand, a situation is conceivable in which, when the wafer chuck 10 is held on the lower surface of the ceiling wall 15 by vacuum suction, the wafer chuck 10 is separated from the lower surface of the ceiling wall 15 due to the power of the suction device being turned off or other reasons. In this case, since the falling restriction claws 38 of each falling restriction mechanism 24 are maintained in the intermediate position, the wafer chuck 10 is received by the plurality of falling restriction claws 38 as shown in FIG. 9. However, a situation is also conceivable in which, when the reduced pressure in the internal space S is released and the wafer chuck 10 separates from the lower surface of the ceiling wall 15, the wafer chuck 10 does not necessarily fall to a fixed position in a stable posture, and a part of its outer circumferential edge portion falls to a position outside the support surfaces 39 of the falling restriction claws 38.

In this case, a part of the outer circumferential edge portion of the wafer chuck 10 abuts the inclined centering surfaces 40*c* of the falling restriction claws 38 and is guided toward the support surfaces 39 along the inclination of the centering surfaces 40*c*. As a result, the wafer chuck 10 is reliably supported in a stable posture on the support surfaces 39 of the four falling restriction claws 38.

When the wafer chuck 10 is transferred to the alignment device 20 together with the wafer W from the state in which the wafer chuck 10 is supported on the support surfaces 39 of the four falling restriction claws 38 as described above, first, the falling restriction claws 38 of the four falling restriction mechanisms 24 are displaced to the advanced position as shown in FIGS. 10 and 11 to center the wafer chuck 10 with respect to the chuck accommodating portion 15*c*. In this case, the fluid control unit 42 is switched to the flow passage state (third flow passage state) shown in FIG. 12, and the air of the second operating pressure (high pressure) is introduced into the second air chamber 48 of the cylinder device 41, and the air in the first air chamber 47 is discharged to the outside. In this case, the load transmission arm 58 connected to the piston rod 46 is already in abutment with the rear end face 57*r* of the load receiving flange 57 of the displacement restriction device 43, but the thrust of the piston 44 acting on the load receiving flange 57 through the load transmission arm 58 increases.

Here, the initial load of the spring member 55 acting on the operating rod 54 of the displacement restriction device 43 is set to be smaller than the thrust of the piston 44 when the air of the second operating pressure (high pressure) is introduced into the second air chamber 48. For this reason, in this case, when the air of the second operating pressure is introduced into the second air chamber 48 and the thrust in the advance direction acts on the piston 44, the load transmission arm 58 overcomes the load of the spring member 55 of the displacement restriction device 43 and displaces to the advanced position. As a result, each falling restriction claw 38 displaces to the advanced position as shown in FIGS. 10 and 11.

In this way, when each falling restriction claw 38 is displaced to the advanced position, the support surfaces 39 of each falling restriction claw 38 come into sliding contact the lower surface of the flange wall 10*f* of the wafer chuck 10, while the centering surfaces 40*c* press the outer circumferential edge portion of the flange wall 10*f* of the wafer chuck 10 toward a center of the chuck accommodating portion 15*c*. As a result, the wafer chuck 10 is centered to coincide with the specified centering position, and its relative position with respect to the chuck holding portion of the alignment device 20 below is also corrected.

Then, the falling restriction claws 38 of the four falling restriction mechanisms 24 are retracted to the intermediate position as shown in FIGS. 7 and 9, and in that state, the chuck holding portion of the alignment device 20 is raised to engage the chuck holding portion with the wafer chuck 10. Then, the falling restriction claws 38 of the four falling restriction mechanisms 24 are displaced to the retracted position, and the chuck holding portion of the alignment device 20 is lowered. The alignment device 20 then moves to a predetermined transfer position and unloads the inspected wafer W.

As described above, in the prober 11 of the present embodiment, the falling restriction mechanism 24 for restricting falling of the wafer chuck 10 includes the plurality of falling restriction claws 38 that are provided to be advanceable and retractable on the lower surface of the measurement unit 16 and restrict falling of the wafer chuck 10 from the lower surface of the measurement unit 16 in the advanced state, and the three position control device 37 that controls the advanced and retracted positions of the plurality of falling restriction claws 38. In addition, the three position control device 37 can switch the positions of the plurality of falling restriction claws 38 to the retracted position for allowing the wafer chuck 10 to pass between the falling restriction claws 38, the intermediate position for receiving the wafer chuck 10 separated from the lower surface of the measurement unit 16 from below, and the advanced position for centering the wafer chuck 10. For this reason, even if the wafer chuck 10 attached by suction to the measurement unit 16 separates from the measurement unit 16 due to the power being turned off or other reasons, the falling of the wafer chuck 10 can be restricted by the falling restriction claws 38 by displacing the falling restriction claws 38 to the intermediate position under the control of the three position control device 37. In addition, from this state, by displacing the plurality of falling restriction claws 38 to the advanced position under the control of the three position control device 37, the wafer chuck 10 can be centered by the plurality of falling restriction claws 38, and the positional deviation between the wafer chuck 10 and the alignment device 20 below it can be corrected. Accordingly, in the case of adopting the prober 11 of the present embodiment, even after the wafer chuck 10 separates from the lower surface of the measurement unit 16 and is temporarily held by the falling restriction mechanism 24, the wafer chuck 10 can be transferred to the alignment device 20 in the suitable position.

Also, in the prober 11 of the present embodiment, the outer circumferential edge portion of the wafer chuck 10 is formed in a circular shape concentric with the wafer W held on its upper surface, and each of the falling restriction claws 38 of the falling restriction mechanisms 24 performs advance and retraction movements in the radial direction of the wafer chuck 10. For this reason, each of the falling restriction claws 38 can advance and retract in the shortest distance without loss relative to the lower surface of the wafer chuck 10, and when the wafer chuck 10 is centered by the plurality of falling restriction claws 38, it becomes possible to quickly center the wafer chuck 10.

In addition, in the prober 11 of the present embodiment, two or more (specifically, four) falling restriction claws 38 are provided apart from each other in the outer circumferential direction of the wafer chuck 10. For this reason, by displacing the two or more falling restriction claws 38 to the advanced position, it becomes possible to easily and accurately center the wafer chuck 10.

Further, in the prober 11 of the present embodiment, each falling restriction claw 38 includes the horizontal support surface 39 that can support the lower surface of the wafer chuck 10, and the restriction wall 40 rising from the end portion of the support surface 39 on the side away from the axial center position o of the wafer chuck 10. In addition, the surface of the restriction wall 40 facing the outer circumferential edge portion of the wafer chuck 10 is the centering surface 40*c* that abuts the outer circumferential edge portion of the wafer chuck 10 when the falling restriction claw 38 is in the advanced position. For this reason, while the wafer chuck 10 is placed on the support surface 39 of the falling restriction claw 38, the centering surface 40*c* of the falling restriction claw 38 can press the outer circumferential edge portion of the wafer chuck 10 from a radially outward side to center the wafer chuck 10. Accordingly, in the case of adopting the present configuration, the wafer chuck 10 can be corrected to the suitable position while maintaining a stable posture.

In addition, in the prober 11 of the present embodiment, the centering surface 40*c* of the falling restriction claw 38 is configured as the inclined surface that is inclined downward toward the axial center side of the wafer chuck 10. For this reason, even if the wafer chuck 10 is significantly deviated from the suitable position when the wafer chuck 10 is separated from the lower surface of the measurement unit 16 due to the power being turned off or other reasons, the lowered wafer chuck 10 can be guided to the vicinity of the suitable position by the inclined centering surface 40*c*. Accordingly, in the case of adopting the present configuration, when the falling restriction claw 38 is displaced to the advanced position, the wafer chuck 10 can be reliably centered by the centering surface 40*c*.

Also, the present invention is not limited to the above embodiment, and various design changes are possible without departing from the gist of the present invention. For example, in the above embodiment, the centering surface 40*c* of the falling restriction claw 38 is configured as an inclined surface, but the centering surface 40*c* does not necessarily have to be an inclined surface. The centering surface 40*c* may be, for example, a surface that rises in the vertical direction.

In addition, in the above embodiment, the position control device that controls the advanced and retracted positions of the falling restriction claw 38 is configured by the three position control device 37. However, the position control device is not limited to the three position control device 37. The position control device may have a function of stopping at four or more positions as long as it can stop at least at three positions, that is, the retracted position, the intermediate position, and the advanced position.

Further, in the above embodiment, the cylinder device 41 is used to operate the piston 44 using an air pressure, but the cylinder device 41 is not limited thereto. The cylinder device 41 may be configured to operate the piston 44 using a pressure of other fluids such as a special gas or liquid.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

10 Wafer chuck
11 Prober
12 Test head
16 Measurement unit
18 Probe card
20 Alignment device
24 Falling restriction mechanism
37 Three position control device (position control device)
38 Falling restriction claw
39 Support surface
40 Restriction wall
**40*c*** Centering surface
**57*r*** Rear end face (load receiving portion)
W Wafer

What is claimed is:

1. A prober comprising:
a measurement unit including a probe card electrically connected to a test head;
a wafer chuck that holds a wafer, on which a plurality of chips are formed, on an upper surface thereof and is held on a lower surface of the measurement unit to bring electrodes of the chips into contact with corresponding probes of the probe card;
an alignment device that detachably engages with the wafer chuck and aligns the wafer held by the wafer chuck with respect to the probe card; and
a falling restriction mechanism configured to restrict falling of the wafer chuck from the lower surface of the measurement unit,
wherein the falling restriction mechanism includes a plurality of falling restriction claws that are provided on the lower surface side of the measurement unit to be advanceable and retractable and restrict the falling of the wafer chuck from the lower surface of the measurement unit in an advanced state, and a position control device configured to control advanced and retracted positions of the plurality of falling restriction claws, and
the position control device is able to switch positions of the plurality of falling restriction claws to a retracted position for allowing the wafer chuck to pass between the falling restriction claws, an intermediate position for receiving the wafer chuck separated from the lower surface of the measurement unit from below, and an advanced position for centering the wafer chuck.

2. The prober according to claim 1,
wherein an outer circumferential edge portion of the wafer chuck is formed in a circular shape concentric with the wafer held on the upper surface of the wafer chuck, and each of the falling restriction claws may advance and retract to move in a radial direction of the wafer chuck.

3. The prober according to claim 2, wherein two or more of the falling restriction claws are provided apart from each other in an outer circumferential direction of the wafer chuck.

4. The prober according to claim 2, wherein each of the falling restriction claws includes a horizontal support surface that is able to support a lower surface of the outer circumferential edge portion of the wafer chuck, and a restriction wall that rises from an end portion of the support surface on a side away from an axial center position of the wafer chuck, and a surface of the restriction wall facing the outer circumferential edge portion of the wafer chuck is configured as a centering surface that abuts the outer circumferential edge portion when the falling restriction claws are in the advanced position.

5. The prober according to claim 4, wherein the centering surface is configured as an inclined surface that is inclined downward toward an axial center side of the wafer chuck.

* * * * *